United States Patent [19]
Prokop

[11] 4,437,141
[45] Mar. 13, 1984

[54] HIGH TERMINAL COUNT INTEGRATED CIRCUIT DEVICE PACKAGE

[75] Inventor: Jon S. Prokop, Richardson, Tex.

[73] Assignee: Texas Instruments Incorporated, Dallas, Tex.

[21] Appl. No.: 301,698

[22] Filed: Sep. 14, 1981

[51] Int. Cl.³ .............................................. H05K 1/14
[52] U.S. Cl. .................................. 361/403; 174/68.5; 361/406; 361/412
[58] Field of Search .............. 361/406, 403, 395, 412; 174/68.5

[56] References Cited

U.S. PATENT DOCUMENTS

| | | | |
|---|---|---|---|
| 2,984,768 | 5/1961 | Henry | 174/68.5 X |
| 2,986,675 | 5/1961 | Burson | 361/406 X |
| 3,189,978 | 6/1965 | Stetson | 174/68.5 |
| 3,263,303 | 8/1966 | Oates | 174/68.5 X |
| 3,588,615 | 6/1971 | Brearly | 361/412 X |
| 3,656,058 | 4/1972 | Leathers | 361/403 X |
| 4,288,841 | 9/1981 | Gogal | 361/395 X |

*Primary Examiner*—R. R. Kucia
*Attorney, Agent, or Firm*—Alva H. Bandy; N. Rhys Merrett; Melvin Sharp

[57] ABSTRACT

An integrated circuit (IC) device package is disclosed suitable for accommodating large terminal count IC devices in a very small space. A first set of terminals is located in notches around the periphery of the package. A second set of terminals is located inboard of the package and are comprised of metallized annular rings on the top and bottom surfaces of the package around holes or apertures through the surfaces of the package with metallization coating the holes to connect the top and bottom annular rings. This second set of terminals may be arranged in rows parallel to the edges of the package and may be connected to the IC device through buried conductor traces and wire bonding techniques. If necessary, additional rows of metallized holes can be utilized in a grid configuration, preferably at 0.050" centers.

12 Claims, 6 Drawing Figures

HIGH TERMINAL COUNT INTEGRATED CIRCUIT DEVICE PACKAGE

This invention relates to an electronic packaging concept and more particularly to a high terminal count integrated circuit device package.

In an integrated circuit, a number of active semiconductor devices are formed on a chip of silicon and interconnected in place by leads to form a complete circuit. As integrated circuit technology has advanced over the years, yields have increased to the point that large arrays of logic circuits can be produced on a single semiconductor slice. Second and third level interconnections can be used to interconnect the individual circuits as desired and provide bonding pads at the edge of the slice. However, these circuit arrays usually require a large number of external connections. Terminal counts in excess of 100 are now required for gate arrays, microprocessors and very high speed integrated circuit (VHSIC) devices.

In the past, integrated circuit chips have been packaged in a variety of ways. The most common packages are the flatpack, the dual-in-line, the hermetic chip carrier and the grid array packages. The flatpack package is not a standardized package in the industry and has thus been generally produced to meet the requirements of a specific device. Leads generally extend from two opposing sides of the package and are generally either on 0.100" or 0.050" centers. These flatpack packages therefore become increasing inefficient and cumbersome to handle as terminal count increases. Some flatpacks have been designed with leads extending from all four sides; however, this design, although an improvement, produces a package which is still very inefficient, expensive and difficult to handle.

Dual-in-line packages have been the accepted standard for packaging integrated circuit chips. Terminals are located on two opposing sides of the package and are configured to extend downward from the package body and through holes in the printed wiring board (PWB) or other suitable substrate. These holes are generally plated through, and when the leads are soldered to them form the interconnection points to the rest of the circuitry. However, dual-in-line packages with terminal counts higher than 64 are not considered to be practical, for a number of reasons, the most notable of which are expense, package fragility and handling, and packaging efficiency. Dual-in-line packages have not been standardized for terminal counts greater than 64 therefore.

The chip carrier is normally square with terminals arranged either on 0.040" or 0.050" centers on the periphery (all four sides) of the package. The chip carrier package is a surface mounted device and therefore no pins extend through the substrate to which the chip carrier is mounted; conductor traces therefore can be routed in any location under the chip package in lower substrate layers. This allows the routing of a high density board in relatively few layers. However, the one main disadvantage of high terminal chip carriers is that they are relatively inefficient in terms of terminal count versus package area. The package area of chip carriers with terminal counts above 84 is driven by terminal count and pinout spacing rather than chip size and therefore lose packaging efficiency.

The grid array (or space array) package is square like the chip carrier but terminals, normally in the form of pins, protrude from the bottom of the package only, and are designed to be inserted in plated-through-holes in a PWB or other suitable substrate. At present, these grid array packages are not standardized and are available in both leaded and leadless versions. Leads or terminals are generally on a 0.100" grid; however, with either version, leaded or leadless, one cannot visually inspect the solder joints underneath the body of the package. In other words, the solder joints on the top side of the PWB are hidden by the package body. For military applications, this is very serious and forces one to use expensive and potentially unreliable inspection techniques, such as X-ray. Another even more serious problem with the grid array package is that the tightly spaced grid of terminals extends completely through the PWB, thereby restricting this area of the PWB primarily to package interconnection conductor traces only. This has the effect of limiting the potential effectiveness of gate array and VLSI devices by limiting the number of devices that can be attached to a given PWB. Further, since the pins extend completely through the board, this effectively blocks off area which could be used for routing interconnection conductor traces. This will increase the number of layers in the PWB and, ultimately, the cost of the PWB.

A variation of the leadless grid array package utilizes metallized holes through the body of the package which is designed to fit over pins mounted into a PWB. This approach still suffers from the PWB routability problem, and the hidden solder joint problem still exists.

Accordingly, it is an object of the present invention to provide a surface mounted IC device package having a very large number of external leads in a very small area.

Another object of the present invention is to provide an IC device package which does not limit the routing density of the printed wiring board (PWB) or other substrate to which is is attached.

Another object of the present invention is to provide an IC device package having a high external terminal count which can be directly surface mounted to a PWB or suitable substrate without intervening pins or terminals.

Another object of the present invention is to provide an IC device package which may be easily mated with a standard PWB or other substrate.

Another object of the present invention is to provide an IC device package which mates with a PWB or other substrate in such a manner as to allow all attachment solder joints to be visually inspected.

A further object of the present invention is to provide an IC device package which allows ease of socketing for test, burn-in and circuit interconnection.

Still another object of the present invention is to provide an IC device package which is practical to manufacture with current manufacturing equipment and which is both reliable and has high structural integrity.

Another object of the present invention is to provide an IC device package having a large number of external leads which may be economically manufactured.

Other objects and features of the invention will become more readily understood from the following detailed description and appended claims when read in conjunction with the accompanying drawings, in which like reference numerals designate like parts throughout the figures thereof, and in which:

Figure 1:
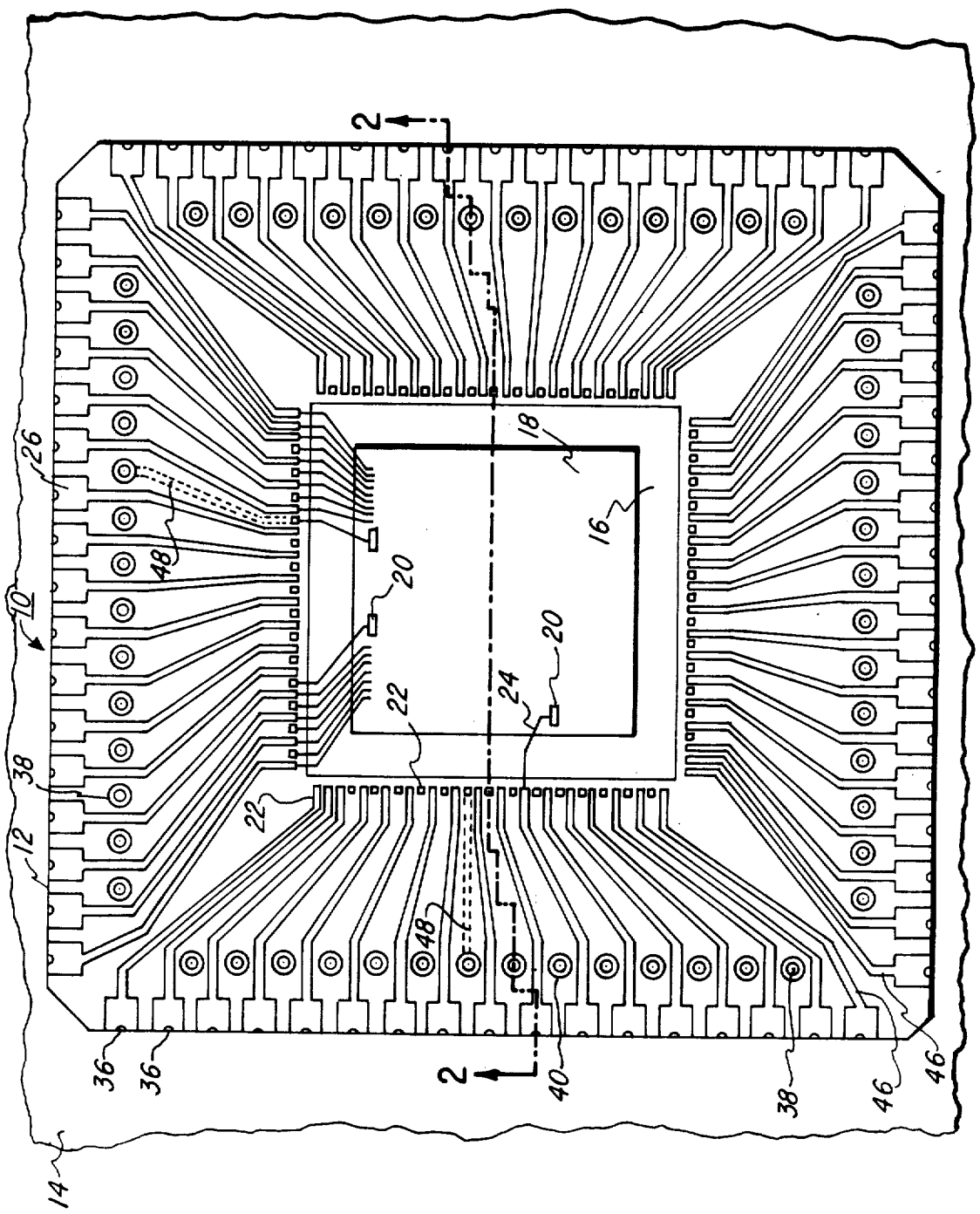
FIG. 1 is a top view of the high terminal current chip carrier device constructed according to the present invention.
Figure 2:
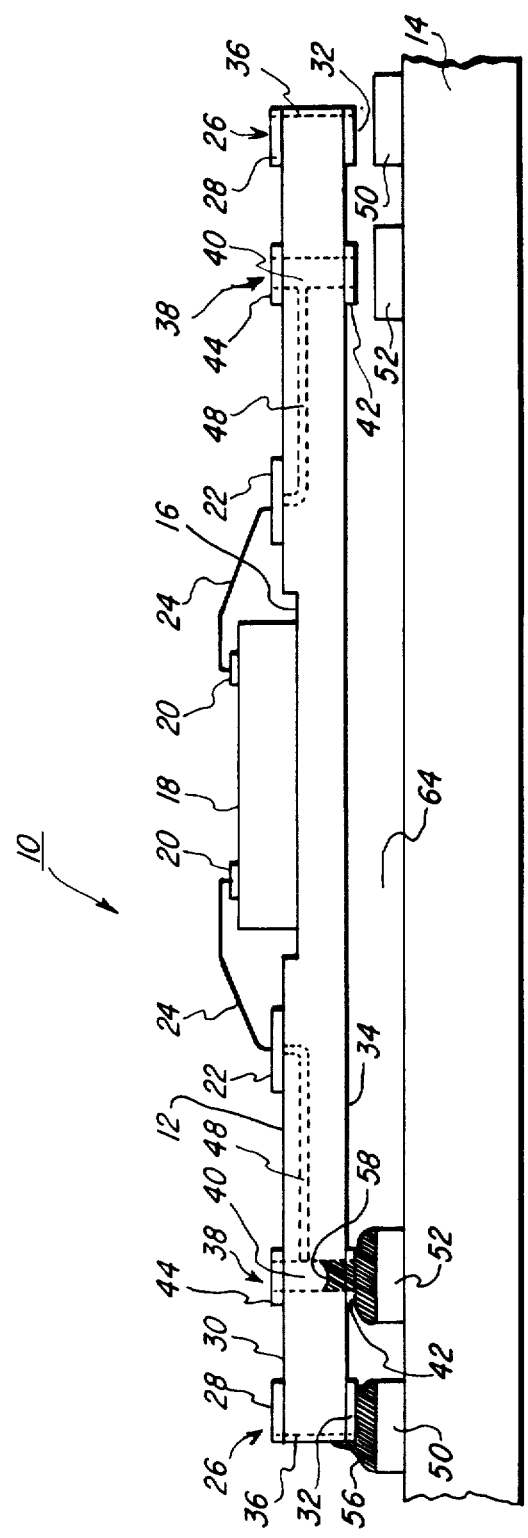
FIG. 2 is a side view of the package constructed according to the present invention attached to the PWB or other suitable substrate.

Referring now to FIGS. 1 and 2, there is illustrated a surface mounted high terminal count IC device package 10 constructed according to the present invention. Package 10 is comprised of a support member 12 which may be made of any suitable insulating material, such as a ceramic, an epoxy impregnated fiberglass fabric, phenolic printed circuit board material or, if desired, may be a metal sheet with an insulated coating thereon, by way of example. Package 10 is connected to a printed wiring board (PWB) 14 or other suitable substrate in a manner which will be described hereinafter. PWB 14 may be formed from substantially any material commonly used for printed circuits, such as epoxy impregnated fiber glass fabric, phenolic printed circuit board, etc., or a metal sheet with an insulated coating thereon. A cavity 16 is formed in the support member 12 for receiving an integrated circuit (IC) device 18 (sometimes referred to as an IC chip or die). The semiconductor chip may form any type of circuit, for example, a microprocessor, a gate array, microcomputer, etc. At this point it should be noted that the drawings are not necessarily to scale, but are merely illustrative of the ultimate package. For each connection that is to be made to a circuit externally of IC device 18, a bonding pad 20 is formed on the surface of the chip. After alignment of the IC chip 18 in cavity 16, bonding pads 20 are connected to a row of wire bonding terminals 22 which surround the IC chip cavity 16 by bonding a wire 24 from bonding pad 20 to wire bonding terminals 22. This bonding step may be completed using conventional ultrasonic bonding or thermal compression bonding techniques.

A first set of terminals or peripheral terminals 26 are formed on the four sides of support member 12. Peripheral terminal 26 is comprised of an expanded pad 28 on the top surface 30 of support member 12 and an expanded pad 32 on the bottom surface 34 of support member 12. In the preferred embodiment, peripheral terminals 26 are formed on support member 12 on 0.050" terminal centers. A metallized notch 36 in the edge of support member 12 interconnects the expanded pads 28 and 32 located on the top and bottom surfaces 30 and 34 of support member 12.

A second set of terminals or metallized hole terminals 38 are formed in proximity to peripheral terminals 26 and are comprised of a metallized hole 40 through support member 12. An expanded pad 42 is connected to the metallized hole 40 on the bottom surface 34 of support member 12 and a second expanded pad 44 is connected to metallized hole 40 on the top surface 30 of support member 12. In the preferred embodiment, expanded pads 42 and 44 are annular (round) metallized pads. In the embodiment illustrated in FIG. 1, metallized hole terminals 38 are located behind the peripheral terminals 26 and are in a staggered or alternating arrangement; terminals 38 are also arranged in rows parallel to the edges of the support member 12.

A plurality of trace conductors 46 (not shown in FIG. 2) interconnects wire bonding terminals 22 with peripheral terminals 26. In a similar manner, trace conductors 48 interconnect wire bonding terminals 22 with metallized hole terminals 38 (shown in dotted lines in FIGS. 1 and 2). As can be seen more clearly in FIG. 2, support member 12 is a multilayered structure to accomodate various conductors running therethrough.

Figure 3:
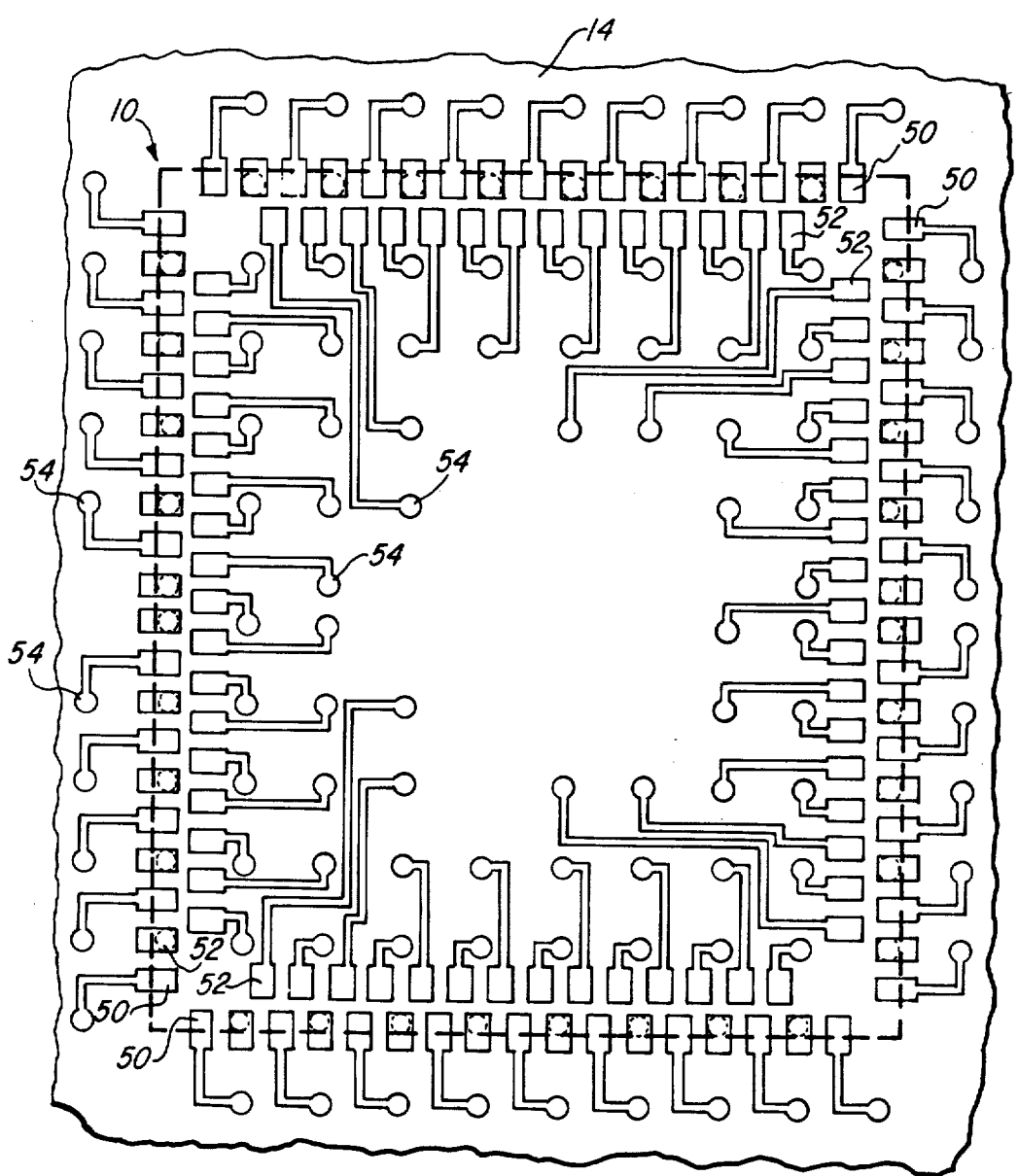
FIG. 3 illustrates a portion of a printed wiring board or other substrate having a "footprint" for the package constructed according to the present invention.

FIG. 2 illustrates how package 10 may be directly surface mounted to substrate 14 without intervening pins or terminals. In FIG. 2, it can be seen how package 10 is surface mounted on substrate 14 such that the expanded pad 32 of peripheral terminal 26 overlies terminal 50 on substrate 14; in like manner, the annular ring 42 on the bottom surface 34 of metallized hole terminal 38 overlies the expanded terminal 52 on substrate 14. FIG. 3 illustrates a top view of package 10 (the outline of which is shown by dotted lines) as it is aligned with substrate 14. The plurality of expanded pads 50 line up with the peripheral terminals 26 (shown in FIG. 2) and the plurality of expanded pads 52 align with the metallized hole terminals 38 (also shown in FIG. 2).

FIG. 3, in essence, illustrates the "footprint" (or electrical interconnection) utilized for interfacing the electrical circuitry on the substrate 14 with the package 10. The plated through holes 54 illustrated in FIG. 3 (and not shown in FIG. 2) are for interconnecting the various terminals 50 and 52 with different trace conductors located in printed wiring board 14 which has multilevel conductors therein.

Referring back to FIG. 2, the surface mounted high terminal count IC device package 10 is attached to PWB 14 using conventional soldering techniques. Normally, solder is plated on or screen printed onto expanded pads 50 and 52. With package 10 in place, the temperature is elevated until the eutectic point of the solder is reached causing the solder to melt and flow to form an electrical connection as illustrated between the contacts on the left side of package 10 in FIG. 2. A distinct advantage of the surface mount feature of package 10 allows easy inspection of the solder joints since solder wicks up the metallized notches 36 of peripheral terminal 26 as well as up in the metallized holes 40 of terminal 38 within the body of package 10 to form smooth fillets 56 (to connect terminal 26 to expanded pad 50) and fillet 58 (to connect expanded pad 52 to metallized hole terminal 38). Thus, an inspector charged with the responsibility for determining good connections between package 10 and PWB 14 would look for nice smooth fillets 56 of the joints along the package periphery and solder within the holes 40 in the body of the package 10. Inspection could be performed for the terminals 38 within the body of the package 10 by looking downward inside the holes with suitable lighting and magnification. Magnification is routinely used to inspect high density devices such as hybrids and integrated circuits at the present time and therefore to inspect the solder connections of metallized hole terminals 38 using magnification is not a serious drawback.

Figure 4:
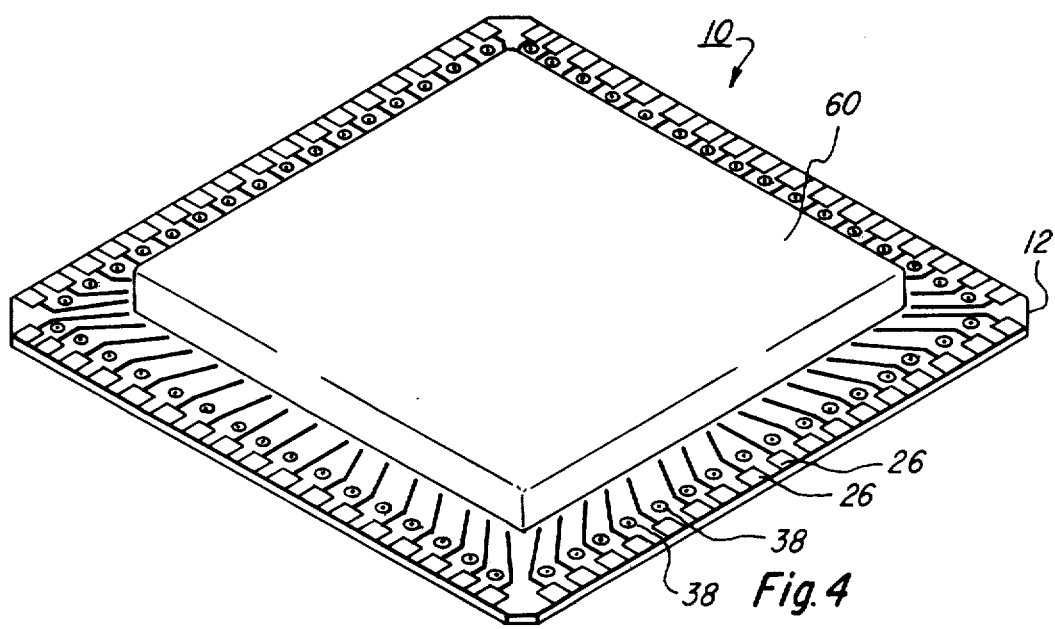
FIG. 4 is a perspective view of the package with a lid mounted on the package.

FIG. 4 illustrates a perspective view of the package constructed according to the present invention with a cap or lid for sealing the integrated circuit chip 18 (FIG. 2) from the atmosphere. Package 10 is designed to use a hot cap sealing technique with devitrifying glasses used on existing single layer chip carriers. This technique produces a very rapid seal which is advantageous for volume production of IC devices and also minimizes the IC chip time at high temperatures which maintains chip reliability.

Figure 5:
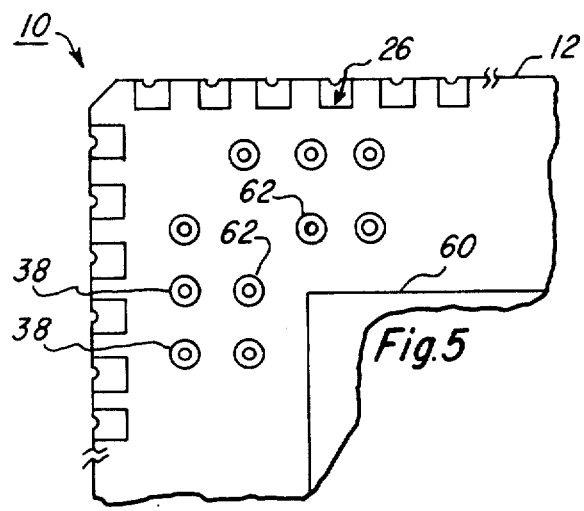
FIG. 5 is a top view of the device package illustrating a grid configuration of the metallized holes.

FIG. 5 illustrates a partial top view of the package 10 with the lid 60 in place covering the integrated circuit chip 18 (shown in FIG. 1). In this embodiment, a first row of metallized hole terminals 38 are shown parallel to the edge of support member 12 along with a second row of metallized holes 62 which are immediately therebehind. The plurality of terminals 38 and 62 form a grid which, in this embodiment, is square although other geometric shapes are also acceptable (such as a rectangle, diamond, etc.). By having a second row of metallized hole terminals 62, the number of available terminals for package 10 is dramatically increased.

Figure 6:
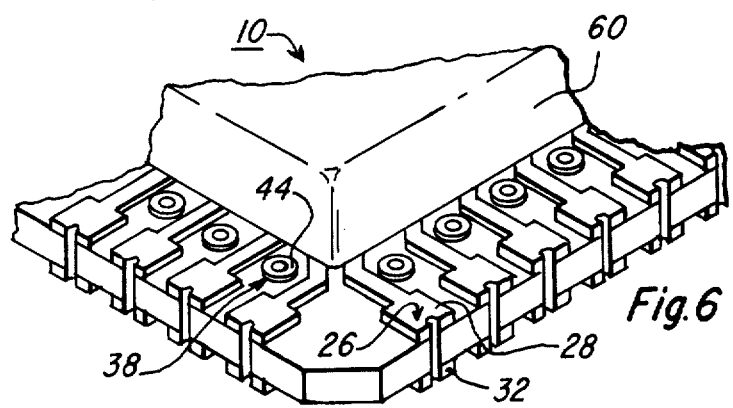
FIG. 6 is an illustration of a portion of the package illustrating raised terminals.

FIG. 6 illustrates the package 10 constructed according to the present invention with lid 60 in place and peripheral terminals 26 and metallized holes 38. However, in this embodiment, the expanded pads 32 and 42 (not shown) on the bottom of terminals 26 and 38 are increased in height or raised; the expanded pads 28 an 44 may be also raised. By raising the bottom pads 32 and 42 (for example, to a heigth of 0.015"), the package 10 is raised a greater distance from substrate 14 producing a volume 64 (in FIG. 2) which facilitates cleaning the PWB 14 after the soldering and other fabrication steps.

The fact that package 10 is constructed to be surface mounted means that there are no pins extending through PWB 14 which frees virtually the entire area of PWB 14 underneath package 10 for routing conductor traces for various multilayer sections of PWB 14. This allows the maximum interconnect density of PWB 14 to be reached which, in turn, allows more packages (like package 10) to be positioned upon PWB 14. This is particularly important for VLSI, VHSIC, and gate array devices in that it allows more devices to be packaged on the same substrate than would otherwise be possible. Thus, maximum functionality can be obtained in the smallest possible packaging volume and the full capability of VLSI, VHSIC, and gate array technologies can be reached.

As mentioned previously, a preferred embodiment allows all terminals to be located on 0.050 inch centers which is well within the capability of present socket manufacturers. Thus, package 10 allows sockets for testing, burn-in, and system usage to be easily developed. These sockets would interconnect with the expanded pads 28 and 44 on the top surface of support member 12. Arranging terminals around the periphery of the package makes use of a part of the package not used in present grid array packages and allows increased terminal count packages with smaller package areas to be developed compared to present grid array packages. Calculations indicate that by placing a row of terminals on 0.050 inch centers located 0.075 inches from the edge of the package and within the body of the package, one could accommodate up to 124 terminals within the same area that is presently used by a 68 terminal 0.050 inch terminal center chip carrier package. By locating another row of terminals 0.050 inches further inboard to the package and parallel to each edge one could accommodate up to 172 terminals within the same envelope. Thus, both of these packages would be considerably more efficient than any existing packages and would be very suitable for VLSI or gate array devices. This can be shown more clearly from Table I set forth below:

| PACKAGE COMPARISONS | | | | | |
|---|---|---|---|---|---|
| EXISTING CHIP CARRIERS | | HIGH TERMINAL COUNT PACKAGE | | EXPANDED HIGH TERMINAL COUNT PACKAGE | |
| TERMINAL COUNT | PACKAGE AREA[1] | TERMINAL COUNT | PACKAGE AREA[1] | TERMINAL COUNT | PACKAGE AREA[1] |
| 44 | 0.423 | 76 | 0.423 | N.A. | N.A. |
| 52 | 0.563 | 92 | 0.563 | N.A. | N.A. |
| 68 | 0.903 | 124 | 0.903 | 172[2] | 0.903 |
| 84 | 1.323 | 156 | 1.323 | 220 | 1.323[3] |
| 100 | 1.823 | 188 | 1.823 | 268 | 1.823 |
| 124 | 2.723 | 236 | 2.723 | 340 | 2.723 |
| 156 | 4.203 | 300 | 4.203 | 436 | 4.203 |

Notes:
[1] Areas in square inches.
[2] Realization of 172 terminals on this package depends on actual size of IC die to be contained therein.
[3] For packages this size and larger, terminal count can be increased further by the addition of further rows of metallized hole terminals.

Thus, it can be seen that the design of package 10 described hereinabove allows high terminal counts to be realized in a very small area, does not limit the routing density of printing wiring board 14, allows all soldered joints to be visually inspected, provides for ease of socketing for test, burn-in, and circuit interconnection, and allows the area under the package to be cleaned with relative ease. Although the present invention has been shown and illustrated in terms of a specific apparatus, it will be apparent that changes or modifications can be made without departing from the spirit and scope of the invention as defined by the appended claims.

What is claimed is:

1. A surface mounted high terminal count integrated circuit device package for solder attachment to a substrate comprising:
   (a) a support member having a centrally disposed chip connect area, top and bottom surfaces and periphery forming sides and walls forming notches in the sides of said support member and a plurality of holes in said support member in preselected patterns adjacent to the notched periphery thereof;
   (b) electrical metallizations on the walls of said notches and plurality of holes of the support member, said metallization of the notches forming metallized notches and said metallization of the holes forming cylindrically shaped electrical leads therethrough, said metallized notches and holes for forming solderable connections between the package and substrate;

(c) a plurality of wire bonding terminals selectively positioned on the support member adjacent said chip connect area;

(d) a plurality of trace conductors having first and second ends, said first ends electrically connected to said plurality of wire bonding terminals; and (e) a plurality of expanded terminal pads mounted on the top and bottom surfaces of the support member, said expanded pads of the top surface electrically connected to the second ends of the trace conductors and together with the expanded pads of the bottom surface electrically connected to the notch and hole metallizations of the support member in open communication with the metallized notches and holes thereof whereby when the bottom pads are soldered to the substrate, solder rises up the open metallized notches and holes to form solder fillets therein for electrical connection of the substrate and for visual inspection thereof.

2. A surface mounted integrated circuit device package according to claim 1 wherein the expanded pads for the metallized hole terminals are annular metallized pads.

3. A surface mounted integrated circuit device package according to claim 1 wherein said trace conductors are positioned at different levels within the support member to interconnect the integrated circuit terminals with the peripheral and metallized hole terminals.

4. A surface mounted high terminal count integrated circuit device package according to claim 1 wherein selected ones of said expanded pads on the bottom surface of said substrate are raised.

5. A surface mounted high terminal count integrated circuit device package according to claim 1 wherein said plurality of metallized hole terminals are located behind said peripheral terminals.

6. A surface mounted high terminal count integrated circuit device package according to claim 1 wherein selected ones of said plurality of metallized hole terminals form a first set of metallized hole terminals alternated between said peripheral terminals.

7. A surface mounted high terminal count integrated circuit device package according to claim 1 wherein said plurality of metallized hole terminals include a second set of metallized hole terminals in proximity to the first metallized hole terminals.

8. A surface mounted high terminal count integrated circuit device package according to claim 7 wherein the two sets of metallized hole terminals of the plurality of hole terminals form a grid pattern.

9. A surface mounted high terminal count integrated circuit device package according to claim 8 wherein said grid pattern is a square.

10. A surface mounted high terminal count integrated circuit device package according to claim 9 wherein the first and second metallized hole terminals of said plurality of hole terminals are on centers equal to or less than 0.100".

11. A surface mounted high terminal count integrated circuit device package according to claim 1 wherein said support material is an insulator.

12. A surface mounted high terminal count integrated circuit device package according to claim 11 wherein said insulator is a ceramic.

* * * * *